(12) United States Patent
Furukawa et al.

(10) Patent No.: US 7,358,140 B2
(45) Date of Patent: Apr. 15, 2008

(54) PATTERN DENSITY CONTROL USING EDGE PRINTING PROCESSES

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 406 days.

(21) Appl. No.: 11/163,968

(22) Filed: Nov. 4, 2005

(65) Prior Publication Data

US 2007/0105319 A1    May 10, 2007

(51) Int. Cl.
   *H01L 21/336*    (2006.01)
(52) U.S. Cl. ............... 438/266; 438/950; 257/E21.645
(58) Field of Classification Search ................ 438/266, 438/267, 945, 946, 950; 257/E21.645
   See application file for complete search history.

(56) References Cited

U.S. PATENT DOCUMENTS

| | | | |
|---|---|---|---|
| 4,808,545 A | 2/1989 | Balasubramanyam et al. | |
| 4,838,991 A | 6/1989 | Cote et al. | |
| 6,150,256 A * | 11/2000 | Furukawa et al. | 438/618 |
| 6,313,492 B1 * | 11/2001 | Hakey et al. | 257/296 |
| 6,638,441 B2 | 10/2003 | Chang et al. | |
| 6,713,348 B2 | 3/2004 | Kao et al. | |
| 6,784,005 B2 | 8/2004 | Lin et al. | |

* cited by examiner

*Primary Examiner*—Chandra Chaudhari
(74) *Attorney, Agent, or Firm*—Schmeiser, Olsen & Watts; William D. Sabo

(57) ABSTRACT

A structure fabrication method. The method comprises providing a design structure that includes (i) a design substrate and (ii) M design normal regions on the design substrate, wherein M is a positive integer greater than 1. Next, N design sacrificial regions are added between two adjacent design normal regions of the M design normal regions, wherein N is a positive integer. Next, an actual structure is provided that includes (i) an actual substrate corresponding to the design substrate, (ii) a to-be-etched layer on the actual substrate, and (iii) a memory layer on the to-be-etched layer. Next, an edge printing process is performed on the memory layer so as to form (a) M normal memory portions aligned with the M design normal regions and (b) N sacrificial memory portions aligned with the N design sacrificial regions.

20 Claims, 6 Drawing Sheets

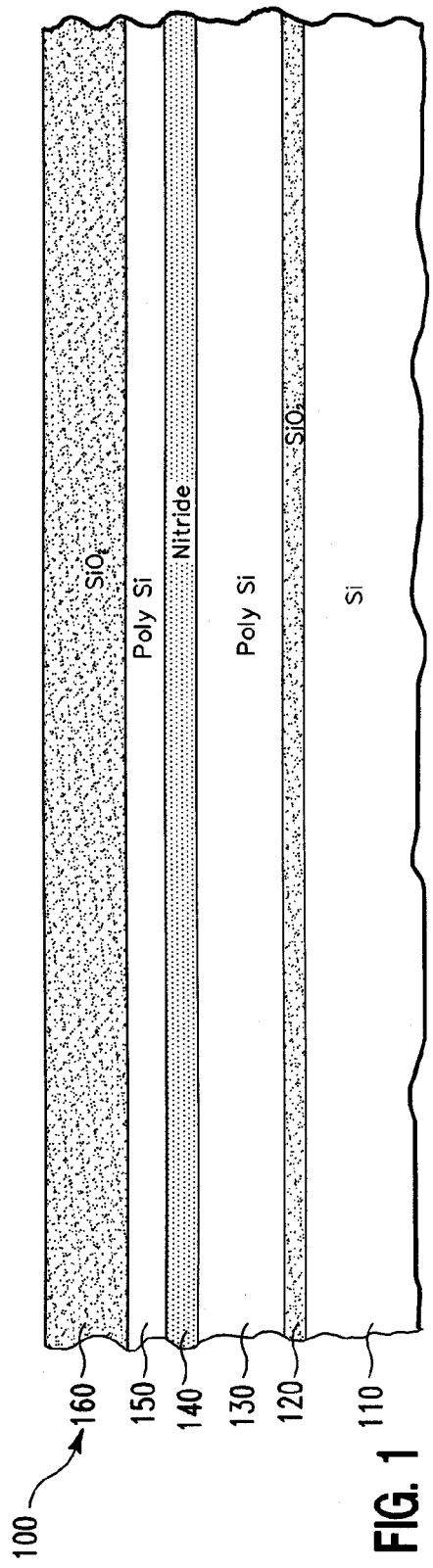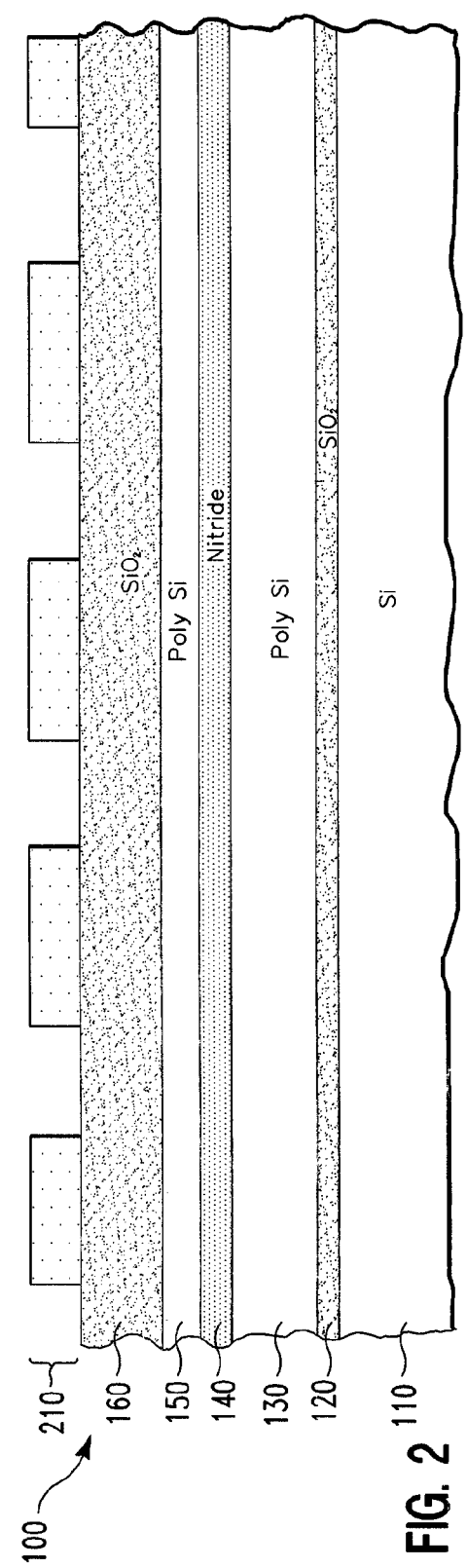

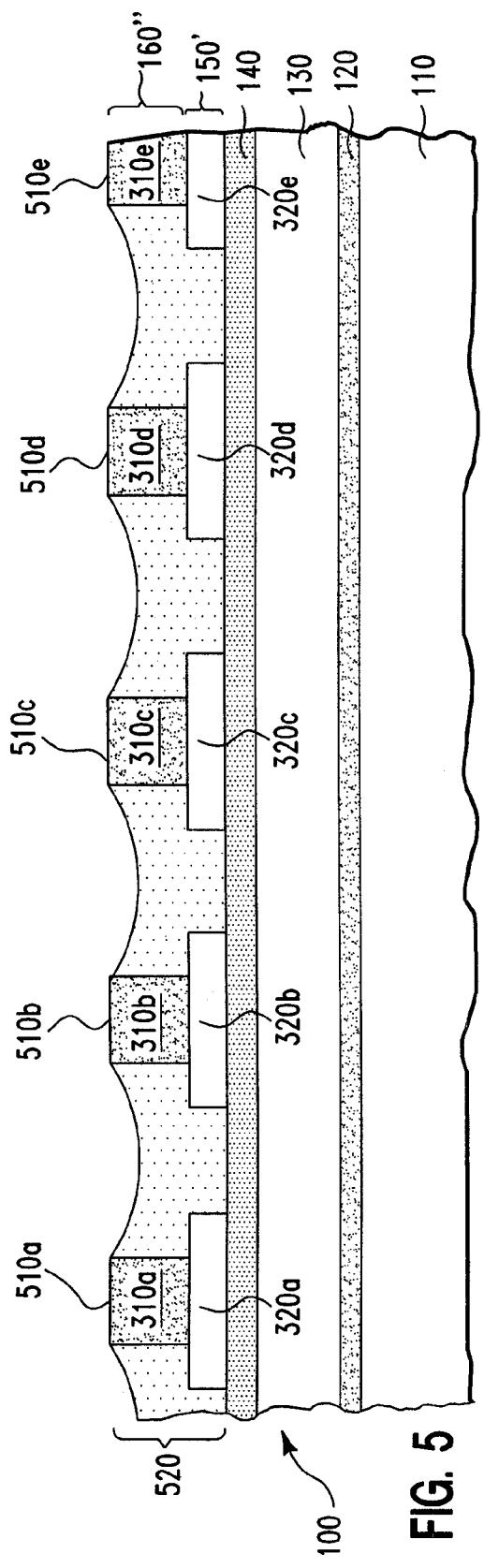
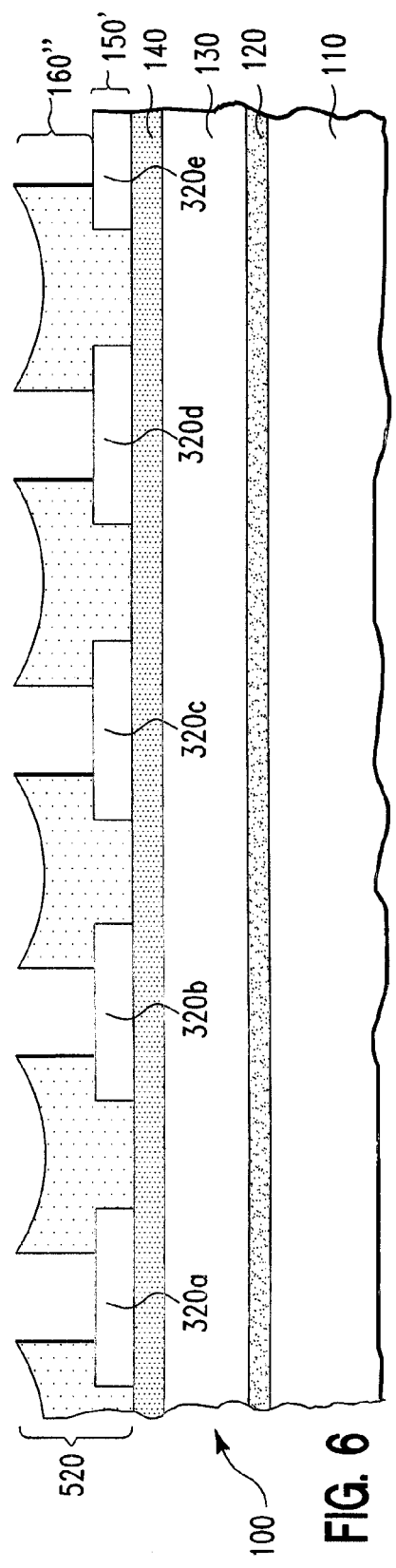

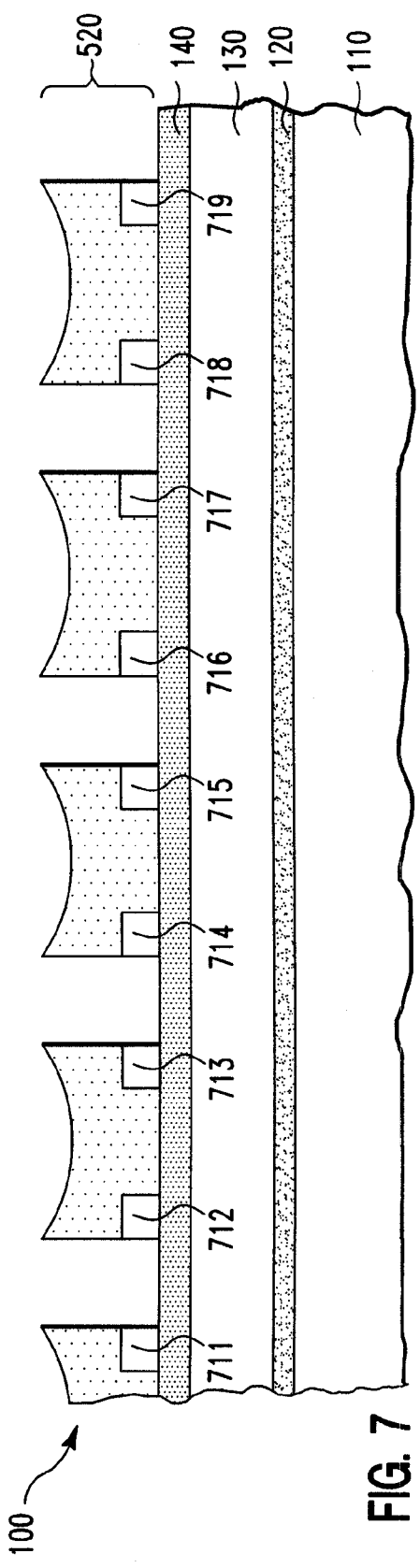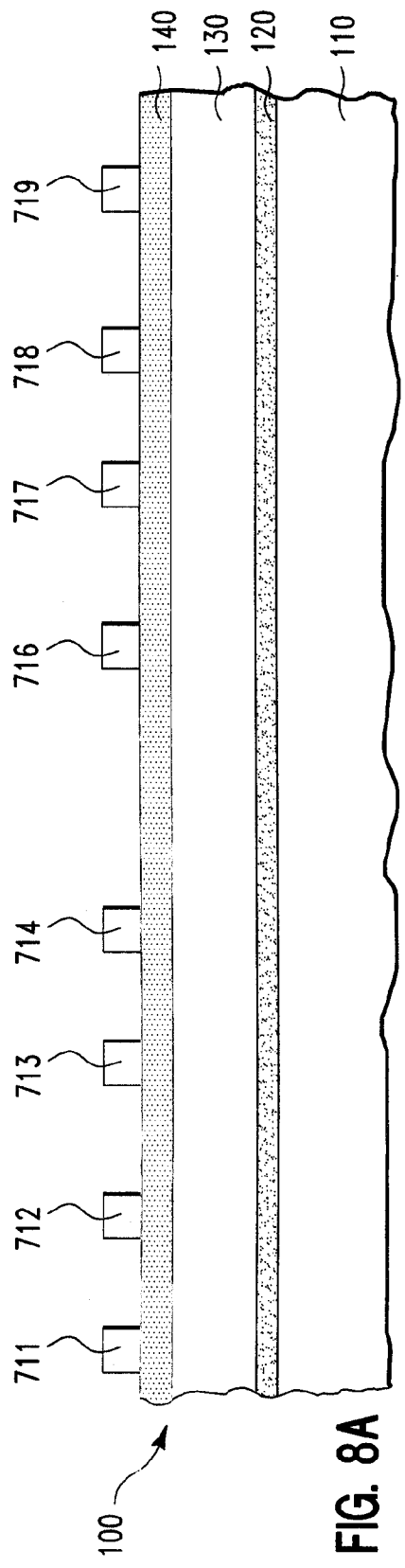

PATTERN DENSITY CONTROL USING EDGE PRINTING PROCESSES

BACKGROUND OF THE INVENTION

1. Technical Field

The present invention relates to pattern density control, and more specifically, to pattern density control using edge printing processes.

2. Related Art

In a conventional sidewall image transfer (SIT) process, memory regions are formed from a memory layer and then used as a blocking mask for etching one or more layers beneath the memory regions so as to transfer the image of the memory regions down to the underlying layer(s). The formation of the memory regions from the memory layer involves a planarization-and-etchback step. However, the planarization-and-etchback step may have variations due to pattern density variation on the wafer. Therefore, there is a need for pattern density control methods in sidewall image transfer (SIT) technologies and other edge printing processes.

SUMMARY OF THE INVENTION

The present invention provides a structure fabrication method, comprising providing a design structure that includes (i) a design substrate and (ii) M design normal regions on the design substrate, wherein M is a positive integer greater than 1; adding, in the design structure, N design sacrificial regions between two adjacent design normal regions of the M design normal regions, wherein N is a positive integer; providing an actual structure that includes (i) an actual substrate corresponding to the design substrate, (ii) a to-be-etched layer on the actual substrate, and (iii) a memory layer on the to-be-etched layer; and performing an edge printing process on the memory layer so as to form (a) M normal memory portions aligned with the M design normal regions and (b) N sacrificial memory portions aligned with the N design sacrificial regions.

The present invention also provides a structure fabrication method, comprising providing a design structure that includes (i) a design substrate and (ii) M design normal regions on the design substrate, wherein M is a positive integer greater than 1; adding, in the design structure, N design sacrificial regions between two adjacent design normal regions of the M design normal regions, wherein N is a positive integer; providing an actual structure that includes (i) an actual substrate corresponding to the design substrate, (ii) a to-be-etched layer on the actual substrate, and (iii) a memory layer on the to-be-etched layer; performing an edge printing process on the memory layer so as to form (a) M normal memory portions aligned with the M design normal regions and (b) N sacrificial memory portions aligned with the N design sacrificial regions; removing the N sacrificial memory portions; and then using the M normal memory portions as a blocking mask to etch the to-be-etched layer so as to form M actual normal regions from the to-be-etched layer, wherein N is an odd number.

The present invention also provides structure fabrication method, comprising providing a design structure that includes (i) a design substrate and (ii) M design normal regions on the design substrate, wherein M is a positive integer greater than 1; adding, in the design structure, N design sacrificial regions between two adjacent design normal regions of the M design normal regions, wherein N is a positive integer; providing an actual structure that includes (i) an actual substrate corresponding to the design substrate, (ii) a to-be-etched layer on the actual substrate, and (iii) a memory layer on the to-be-etched layer; performing an edge printing process on the memory layer so as to form (a) M normal memory portions aligned with the M design normal regions and (b) N sacrificial memory portions aligned with the N design sacrificial regions; and then using the M normal memory portions and the N sacrificial memory portions as a blocking mask to etch the to-be-etched layer so as to form M actual normal regions and N actual sacrificial regions, respectively, from the to-be-etched layer, wherein N is an odd number.

The present invention provides pattern density control methods in sidewall image transfer (SIT) technologies and other edge printing processes.

BRIEF DESCRIPTION OF THE DRAWINGS

FIGS. 1-8A-C show cross-section views of a structure going through fabrication steps of a sidewall image transfer (SIT) process, in accordance with embodiments of the present invention.

DETAILED DESCRIPTION OF THE INVENTION

Figure 3:
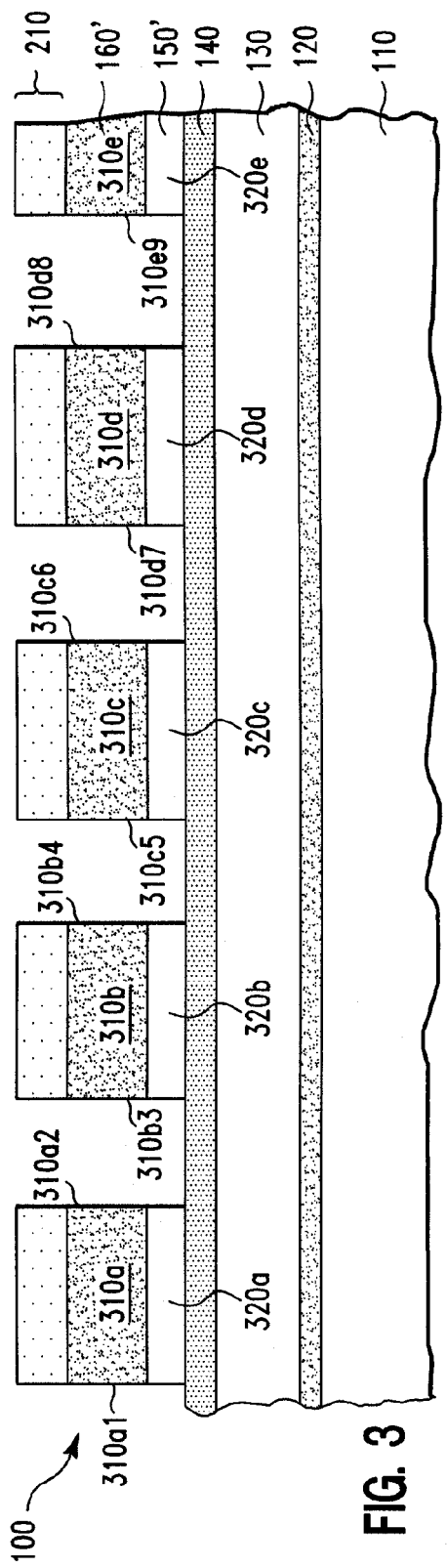

FIGS. 1-8C show cross-section views of a structure 100 going through fabrication steps of a subtractive sidewall image transfer (SIT) process, in accordance with embodiments of the present invention. More specifically, with reference to FIG. 1, in one embodiment, the SIT process starts out with a semiconductor substrate 110, a gate dielectric layer 120, a gate electrode layer 130, a hard mask layer 140, a memory layer 150, and a positioning layer 160 on top of one another as shown. Illustratively, the layers 110, 120, 130, 140, 150, and 160 comprise silicon (Si), silicon dioxide ($SiO_2$), polysilicon, silicon nitride, polysilicon, and silicon dioxide, respectively.

Next, with reference to FIG. 2, in one embodiment, a patterned photoresist layer 210 is formed on top of the oxide positioning layer 160 by, illustratively, a lithographic process.

Next, with reference to FIG. 3, in one embodiment, the oxide positioning layer 160 (FIG. 2) is directionally etched with the patterned photoresist layer 210 serving as a blocking mask, resulting in a patterned oxide positioning layer 160'. The patterned oxide positioning layer 160' comprises, illustratively, oxide positioning regions 310a, 310b, 310c, 310d, and 310e having vertical side walls 310a1, 310a2, 310b3, 310b4, 310c5, 310c6, 310d7, 310d8, and 310e9, respectively.

Next, in one embodiment, the polysilicon memory layer 150 (FIG. 2) is directionally etched with the patterned photoresist layer 210 serving as a blocking mask, resulting in a patterned polysilicon memory layer 150'. The patterned polysilicon memory layer 150' comprises memory regions 320a, 320b, 320c, 320d, and 320e directly beneath the oxide positioning regions 310a, 310b, 310c, 310d, and 310e, respectively.

Figure 4:
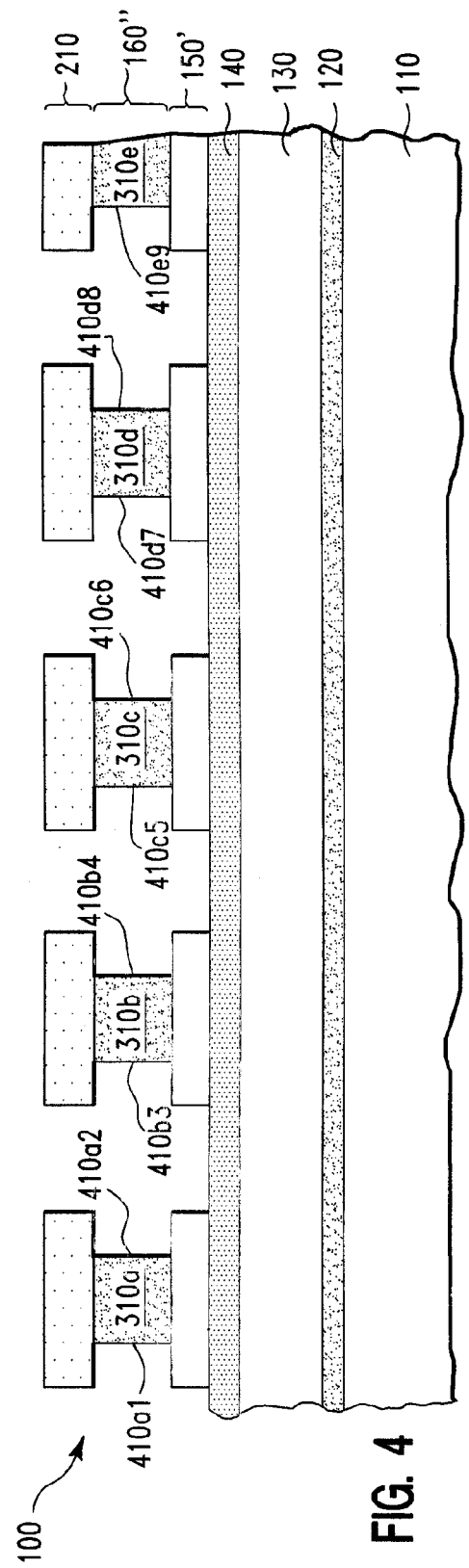

Next, with reference to FIGS. 3 and 4, in one embodiment, the oxide positioning layer 160' is laterally indented (i.e., trimmed) so as to undercut the patterned photoresist layer 210 resulting in the oxide positioning layer 160" (FIG. 4). As a result, the side walls 310a1, 310a2, 310b3, 310b4, 310c5, 310c6, 310d7, 310d8, and 310e9 (FIG. 3) retreat and become side walls 410a1, 410a2, 410b3, 410b4, 410c5, 410c6, 410d7, 410d8, and 410e9 (FIG. 4), respectively.

Illustratively, the oxide positioning layer 160' (FIG. 3) is laterally indented by a chemical oxide removal (COR) process. In one embodiment, the COR process comprises exposing the structure 100 to a gaseous mixture of HF and ammonia at a pressure of about 30 mTorr or below, preferably at a pressure between about 1 mTorr and about 10 mTorr, and a temperature of about 25° C., or a temperature slightly above room temperature. The ratio of gaseous HF to gaseous ammonia is from about 1:10 to about 10:1, with a ratio of about 2:1 being more highly preferred. A solid reaction product is formed as a result of the structure 100 being exposed to HF and ammonia gas. The solid reaction product includes etched oxide, reactants, or combinations thereof. The solid reaction product can be removed by (a) heating the structure 100 to a temperature about 100° C. thus causing the reaction product to evaporate and then (b) rinsing the structure 100 in water, or removing with an aqueous solution.

Next, with reference to FIG. 4, in one embodiment, the patterned photoresist layer 210 is removed by, illustratively, a wet etch.

Next, with reference to FIG. 5, in one embodiment, a memory protection layer 520 is formed on top of the structure 100 such that top surfaces 510a, 510b, 510c, 510d, and 510e of the oxide positioning regions 310a, 310b, 310c, 310d, and 310e, respectively, are exposed to the surrounding ambient whereas the memory regions 320a, 320b, 320c, 320d, and 320e are not. In one embodiment, the memory protection layer 520 is formed by (i) spin-applying an organic material on top of the entire structure 100 of FIG. 4 (with the patterned photoresist layer 210 having been removed) and then (ii) etching back the spun-on organic material until the top surfaces 510a, 510b, 510c, 510d, and 510e of the oxide positioning regions 310a, 310b, 310c, 310d, and 310e, respectively, are exposed to the surrounding ambient.

Next, in one embodiment, the oxide positioning regions 310a, 310b, 310c, 310d, and 310e (i.e., the patterned oxide positioning layer 160") are removed by, illustratively, a wet etch so as to expose the memory regions 320a, 320b, 320c, 320d, and 320e, respectively, to the surrounding ambient. The resulting structure 100 is shown in FIG. 6.

Next, with reference to FIG. 6, in one embodiment, the memory regions 320a, 320b, 320c, 320d, and 320e are directionally etched stopping at the hard mask layer 140 with the memory protection layer 520 serving as a blocking mask. As a result of the etching, what remain of the memory regions 320a, 320b, 320c, 320d, and 320e comprise the memory portions 711, 712, 713, 714, 715, 716, 717, 718, and 719, respectively (FIG. 7). The resulting structure 100 is shown in FIG. 7. In one embodiment, the etching of the memory regions 320a, 320b, 320c, 320d, and 320e can be a reactive ion etching (RIE) process.

Next, with reference to FIG. 7, in one embodiment, the memory protection layer 520 is removed by, illustratively, a wet etch.

It should be noted that each of the memory portions 711, 712, 713, 714, 715, 716, 717, 718, and 719 can be either sacrificial (temporary) or normal (employed to define final patterns in the polysilicon gate electrode layer 130. Sacrificial memory portions are useful in reducing pattern-related process non-uniformities in the thickness of memory protection layer 520.

In a first example, assume that the memory portion 715 is a sacrificial one, as opposed to a normal one. As a result, the memory portion 715 can be removed by, illustratively, a lithography-and-etch process. More specifically, the memory portion 715 is removed by (i) forming a pattern photoresist layer (not shown) on top of the entire structure 100 such that only the memory portion 715 (but not the other normal memory portions 711, 712, 713, 714, 716, 717, 718, and 719) is exposed to the surrounding ambient, then (ii) etching the memory portion 715 with a wet etch, and (iii) removing the pattern photoresist layer. The resulting structure 100 after the sacrificial memory portion 715 is removed is shown in FIG. 8A.

In one embodiment, each of the memory regions 320a, 320b, 320c, 320d, and 320e (FIG. 6) has a shape of a rectangle (if viewed top down). As a result, the memory portions 711 and 712 resulting from the memory region 320a (FIG. 6) are parts of a closed loop (namely, the closed loop 711,712) that can be recognized if viewed from top down. Similarly, the memory portions 713 and 714 resulting from the memory region 320a (FIG. 6) are parts of a closed loop 713,714, and so on. In one embodiment, after the memory protection layer 520 is removed, a lithographic step can be performed to simultaneously trim the four shown closed loops 711,712; 713,714; 715,716; and 717,718 such that the memory portions 711 and 712 are physically separated from each other, the memory portions 713 and 714 are physically separated from each other, the memory portions 717 and 718 are physically separated from each other, and the memory portion 715 is removed leaving behind the memory portion 716. The resulting structure 100 is shown in FIG. 8A.

Figure 8B:
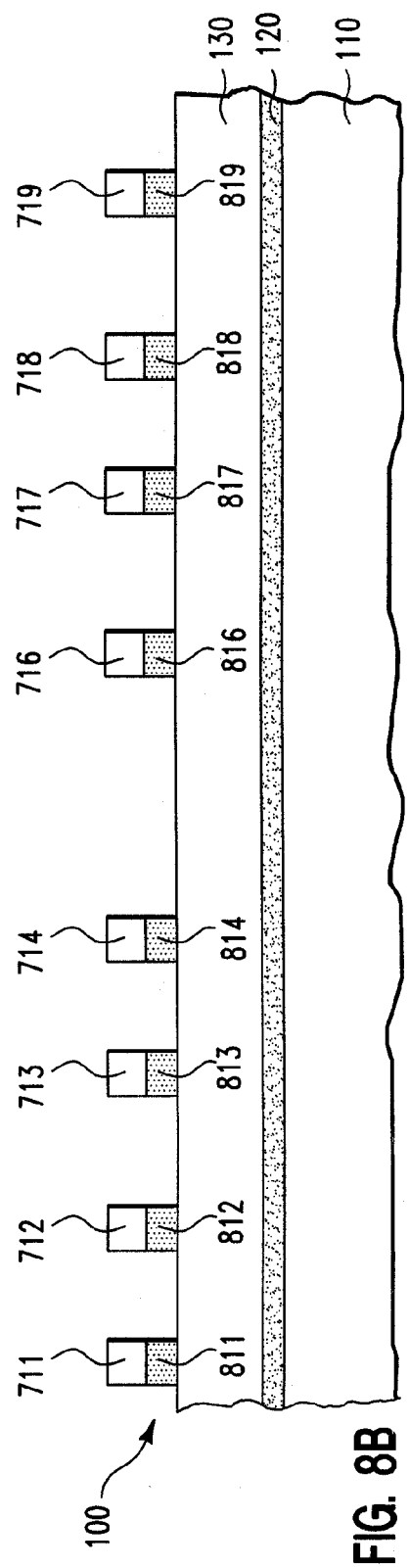

Next, with reference to FIG. 8A, in one embodiment, the nitride hard mask layer 140 is directionally etched stopping at the polysilicon gate electrode layer 130 with the memory portions 711, 712, 713, 714, 716, 717, 718, and 719 serving as a blocking mask. As a result, what remain of the nitride hard mask layer 140 after the etching of the nitride hard mask layer 140 comprise nitride hard mask regions 811, 812, 813, 814, 816, 817, 818, and 819 (FIG. 8B) directly beneath the memory portions 711, 712, 713, 714, 716, 717, 718, and 719, respectively. The resulting structure 100 is shown in FIG. 8B. In one embodiment, the etching of the nitride hard mask layer 140 can be a reactive ion etching (RIE) process.

Figure 8C:
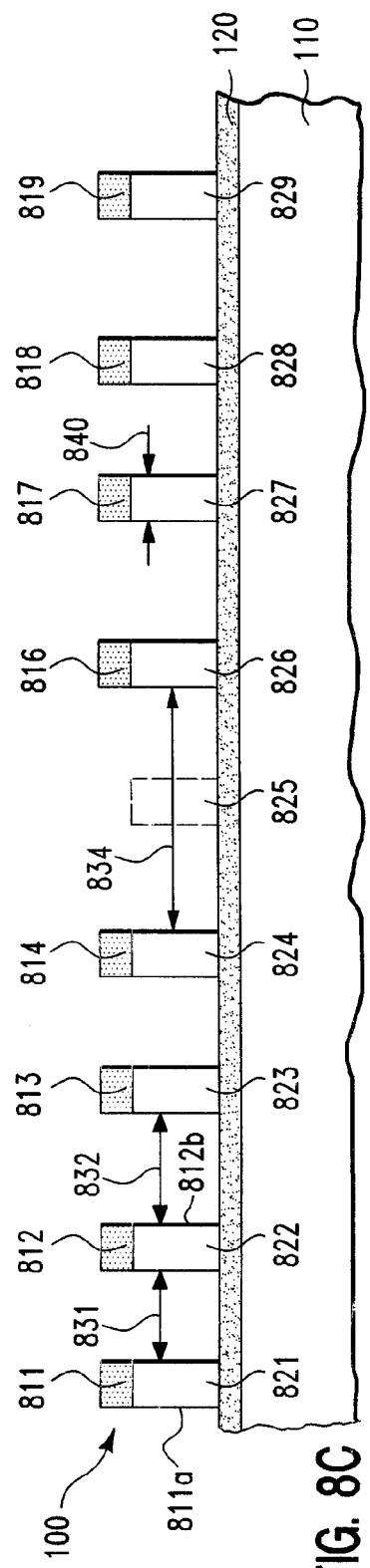

Next, with reference to FIGS. 8B-8C, in one embodiment, the polysilicon gate electrode layer 130 is directionally etched stopping at the gate dielectric layer 120 with the nitride hard mask regions 811, 812, 813, 814, 816, 817, 818, and 819 serving as a blocking mask. As a result, what remain of the polysilicon gate electrode layer 130 comprise polysilicon gate electrode regions 821, 822, 823, 824, 826, 827, 828, and 829 directly beneath the nitride hard mask regions 811, 812, 813, 814, 816, 817, 818, and 819, respectively. The resulting structure 100 is shown in FIG. 8C. It should be noted that the etching of the polysilicon gate electrode layer 130 also removes the polysilicon memory portions 711, 712, 713, 714, 716, 717, 718, and 719.

With reference to FIG. 8C, in one embodiment, the polysilicon gate electrode regions 821, 822, 823, 824, 826, 827, 828, and 829 can operate as gate electrodes for 8 transistors (not shown) whose source/drain regions can be formed in the semiconductor substrate 110.

With reference back to FIG. 7, in a second example, assume alternatively that the memory portions 714, 715, and 716 are not needed (i.e., the memory portions 714, 715, and 716 are sacrificial ones). As a result, after the memory protection layer 520 is removed, the memory portions 714, 715, and 716 can then be removed by, illustratively, a lithographic process in a manner similar to the manner described in the first example above, resulting in the structure 100 of FIG. 9A.

Figure 9A:
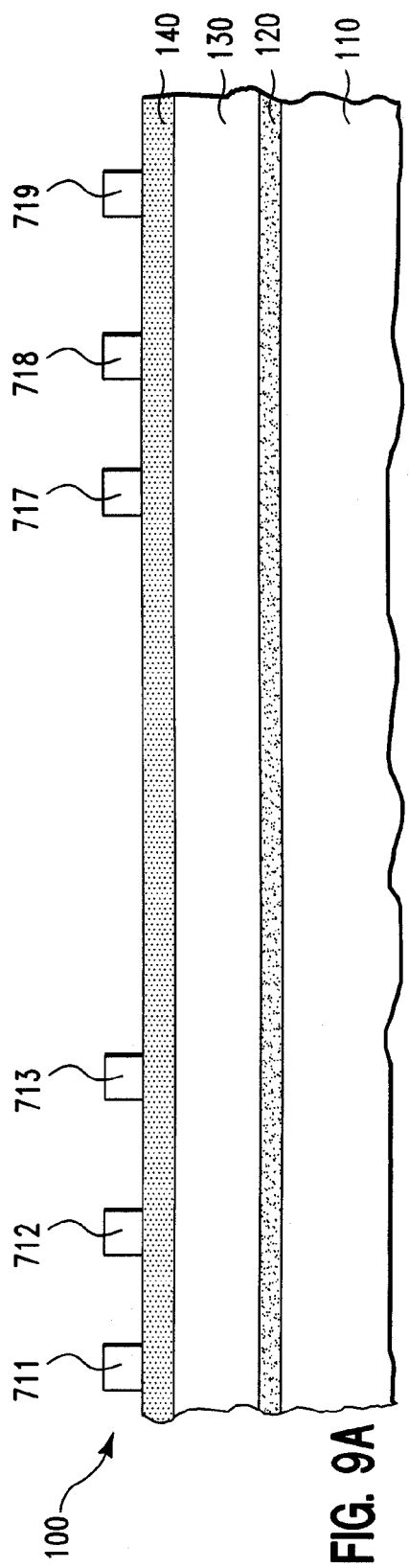
FIGS. 9A-9B show another embodiment of the SIT process of FIGS. 1-8C.

Next, with reference to FIG. 9A, the nitride hard mask layer 140 is directionally etched stopping at the polysilicon gate electrode layer 130 with the memory portions 711, 712, 713, 717, 718, and 719 serving as a blocking mask so as to form nitride hard mask regions 811, 812, 813, 817, 818, and 819 (FIG. 9B) directly beneath the memory portions 711, 712, 713, 717, 718, and 719, respectively.

Figure 9B:
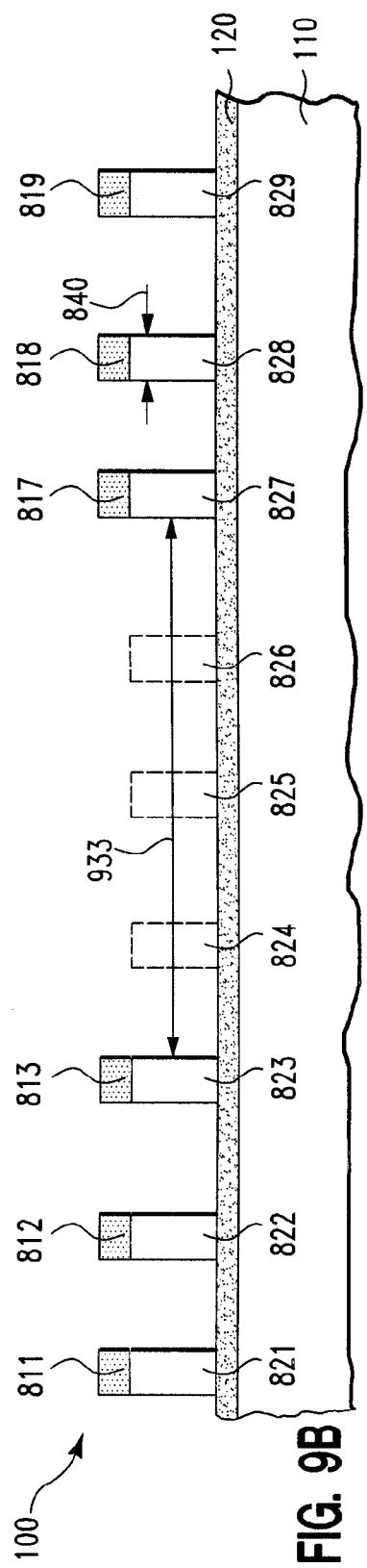

Next, with reference to FIGS. 9A and 9B, in one embodiment, the polysilicon gate electrode layer 130 is directionally etched stopping at the gate dielectric layer 120 with the nitride hard mask regions 811, 812, 813, 817, 818, and 819 serving as a blocking mask so as to form polysilicon gate electrode regions 821, 822, 823, 827, 828, and 829 directly beneath the nitride hard mask regions 811, 812, 813, 817, 818, and 819, respectively.

With reference to FIG. 9B, in one embodiment, the polysilicon gate electrode regions 821, 822, 823, 827, 828, and 829 can operate as gate electrodes for 6 transistors (not shown) whose source/drain regions can be formed in the semiconductor substrate 110.

With reference to FIG. 8C, in one embodiment, the structure 100 of FIG. 8C is a design structure to be fabricated wherein the distance between any two adjacent polysilicon gate electrode regions is at least the critical dimension (hereafter referred to as CD. In general, the critical dimension is the minimum feature size of features of a device to be formed by lithography below which the image formation is no longer consistent. For instance, the distance 831 between the right or left edges of two adjacent polysilicon gate electrode regions 821 and 822 is at least CD. Similarly, the distance 832 between two adjacent polysilicon gate electrode regions 822 and 823 is at least CD. Similarly, the distance 834 between two adjacent polysilicon gate electrode regions 824 and 826 is at least CD. In one embodiment, the critical dimension can be pre-specified at a certain value obtained from empirical data from experiments.

In one embodiment, the distance 834 between two adjacent polysilicon gate electrode regions 824 and 826, as determined by the distance between memory portions 714 and 716 (FIG. 8B), is at least 2CD+Wg wherein Wg denotes the width 840 of the polysilicon gate electrode regions 821, 822, 823, 824, 826, 827, 828, and 829. As a result, a sacrificial memory portion 715 can be added to the design structure 100 of FIG. 7 at a position such that the condition that the distance between any two adjacent memory portions (sacrificial or normal) is at least CD is still satisfied. Then, the revised design structure 100 including the sacrificial memory portion 715 is fabricated in the manner described above as if the sacrificial memory portion 715 would be fabricated like the other normal memory portions 711, 712, 713, 714, 716, 717, 718, 719. However, before the nitride hard mask layer 140 (FIG. 7) is etched, the polysilicon memory portion 715 is removed resulting in the structure 100 of FIG. 8A.

Similarly, with reference to FIG. 9A, in one embodiment, the structure 100 of FIG. 9A is a design structure to be fabricated wherein the distance between any two adjacent polysilicon gate electrode regions, as determined by the distance between any two adjacent memory portions, is at least CD. In one embodiment, the distance 933 between two adjacent polysilicon gate electrode regions 823 and 827 is at least 4CD+3Wg. As a result, 3 sacrificial memory portions 714, 715, and 716 can be added to the design structure 100 of FIG. 9A at positions such that the condition that the distance between any two adjacent memory portions (sacrificial or normal) is at least CD is still satisfied. Then, the revised design structure 100 including the 3 sacrificial memory portions 714, 715, 716 is fabricated in the manner described above as if the 3 sacrificial memory portions 714, 715, 716 would be fabricated like the other normal polysilicon memory portions 711, 712, 713, 717, 718, 719. However, before the nitride hard mask layer 140 (FIG. 7) is etched, the polysilicon memory portions 714, 715, and 716 are removed resulting in the structure 100 of FIG. 9A.

In summary, the addition of sacrificial polysilicon memory portions in the design helps spreading the memory portions (sacrificial and normal) more evenly across the design. Therefore, the fabrication of the structure becomes less affected by pattern variation. As a result of having more-uniform pattern density, there is a much lesser risk of exposing the memory regions 320a, 320b, 320c, 320d, and 320e (FIG. 5) where the spin-applied memory protection layer 520 (FIG. 5) is thinner during the formation of the memory protection layer 520 (FIG. 5).

In the embodiments described above, the sacrificial shapes are formed only in the memory layer 150. Alternatively, in some situations, such as where polysilicon gate electrode etching is pattern sensitive, it may be advantageous to trim off the sacrificial shapes after gate electrode etching rather than immediately after memory portion formation. In this alternative embodiment, as depicted in FIG. 9B, the polysilicon gate electrodes 824, 825, and 826 are fabricated in the same manner as described above for normal polysilicon gate electrodes 821, 822, 823, 827, 828, and 829, and can be subsequently removed using lithography and etch.

In the embodiments described above, the formation of the polysilicon gate electrode regions 821, 822, 823, 824, 825, 826, 827, 828, and 829 is a subtractive SIT process. In an alternative embodiment, the formation of the polysilicon gate electrode regions 821, 822, 823, 824, 825, 826, 827, 828, and 829 is an additive SIT process. More specifically, illustratively, with reference to FIG. 3, the patterned photoresist layer 210 can be removed. Next, spacers (not shown) are formed on side walls of the oxide positioning regions 310a, 310b, 310c, 310d, and 310e. Next, the oxide positioning regions 310a, 310b, 310c, 310d, and 310e are removed. Next, the spacers are used as a blocking mask to etch the underlying layers so as to form the polysilicon gate electrode regions 821, 822, 823, 824, 825, 826, 827, 828, and 829 as shown in FIG. 8C. It should be noted that the sacrificial polysilicon gate electrode region 825 (FIG. 8C) can remain in the final product or can be removed during the fabrication process as described above.

In the embodiments described above, the formation of the polysilicon gate electrode regions 821, 822, 823, 824, 825, 826, 827, 828, and 829 is a subtractive or additive SIT process. In yet another alternative embodiment, the formation of the polysilicon gate electrode regions 821, 822, 823, 824, 825, 826, 827, 828, and 829 involves a phase shift process. More specifically, illustratively, the phase shift process starts with a structure (not shown) that is similar to the structure 100 of FIG. 1 but does not have the top layers 150 and 160. Next, a photoresist layer (not shown) is formed on top of the structure. Next, the photoresist layer is exposed to lights through a reticle (or a mask) that comprises (i) first clear areas not covered with phase-shifter and (ii) second clear areas covered with 180° phase-shifter such that the edges where the first and second clear areas abut each other are directly above the positions of the later fabricated sacrificial and normal polysilicon gate electrode regions

821, 822, 823, 824, 825, 826, 827, 828, and 829. Due to destructive interference of light coming through the first and second clear areas of the reticle, narrow strips of the photoresist layer directly beneath the edges are essentially not exposed to light. As a result, after resist development, the narrow photoresist strips remain and are used to etch the underlying layer(s) so as to form the polysilicon gate electrode regions 821, 822, 823, 824, 825, 826, 827, 828, and 829. As mentioned above, the sacrificial polysilicon gate electrode region 825 (FIG. 8C) can remain in the final product or can be removed during the fabrication process as described above.

In the embodiments described above, the number of inserted sacrificial memory portions is odd (i.e., 1 as in FIGS. 8C and 3 as in FIG. 9B). In general, the number of inserted sacrificial polysilicon gate electrode regions can be any positive integer (odd or even).

In summary, in the embodiments above, the process of the present invention starts out with a design structure 100 of FIG. 8C that includes the design substrate 110 and the design normal regions 821, 822, 823, 824, 826, 827, 828, and 829. Next, the design sacrificial region 825 (FIG. 8C) is added to the design structure 100 between two adjacent design normal regions 824 and 826. Next, an actual structure 100 (FIG. 1) is provided that basically comprises (i) the actual substrate 110 corresponding to the design substrate 110, (ii) the to-be-etched layer 130, and the memory layer 150. Next, an edge printing process (a subtractive SIT process, an additive SIT process, or a phase-shift process as described above) is performed on the memory layer 150 (FIG. 1) as to form the normal memory portions 711, 712, 713, 714, 716, 717, 718, and 719 (FIG. 7) and the sacrificial memory portion 715 (FIG. 7) according to (i.e., aligned with) the design normal regions 821, 822, 823, 824, 826, 827, 828, and 829 (FIG. 8C) and the design sacrificial region 825, respectively.

Next, the normal and sacrificial memory portions 711-719 are used as a blocking mask to etch the underlying to-be-etched layer 130 so as to form the actual normal and sacrificial regions 821, 822, 823, 824, 825, 826, 827, 828, and 829 from the underlying to-be-etched layer 130. Alternatively, before the etching of the to-be-etched layer 130, the sacrificial memory portion 715 corresponding to the design sacrificial region 825 is removed. As a result, the ensuing etching of the to-be-etched layer 130 results in only the actual normal regions 821, 822, 823, 824, 826, 827, 828, and 829 from the underlying to-be-etched layer 130.

It should be noted that, if the edge printing process is the phase-shift process, then the photoresist layer described above plays the role of the memory layer above. The photoresist layer will be patterned by the phase-shift process and then the patterned photoresist layer is used to etch the underlying to-be-etched layer 130 as described above.

The process of the present invention as applied to the design structure 100 of FIG. 9B is similar to what is described above for FIG. 8C.

It should be noted that the subtractive SIT process, the additive SIT process, and the phase-shift process are considered edge printing processes because each of them involves the use of edges of an overlying layer in determining where to print regions in an underlying layer. More specifically, the subtractive and additive SIT processes use the edges of the oxide positioning regions 310a, 310b, 310c, 310d, and 310e (FIG. 3) to determine where to print the regions 821-829 (FIG. 8C). The phase-shift process uses the edges where the first and second clear areas (not shown but described above) of the mask abut each other to determine where to the regions 821-829 (FIG. 8C).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure fabrication method, comprising:
    providing a design structure that includes (i) a design substrate and (ii) M design normal regions on the design substrate, wherein M is a positive integer greater than 1;
    adding, in the design structure, N design sacrificial regions between two adjacent design normal regions of the M design normal regions, wherein N is a positive integer;
    providing an actual structure that includes (i) an actual substrate corresponding to the design substrate, (ii) a to-be-etched layer on the actual substrate, and (iii) a memory layer on the to-be-etched layer; and
    performing an edge printing process on the memory layer so as to form (a) M normal memory portions aligned with the M design normal regions and (b) N sacrificial memory portions aligned with the N design sacrificial regions.

2. The method of claim 1, further comprising:
    removing the N sacrificial memory portions; and then
    using the M normal memory portions as a blocking mask to etch the to-be-etched layer so as to form M actual normal regions from the to-be-etched layer.

3. The method of claim 2, further comprising physically separating the M normal memory portions from each other, wherein said removing the N sacrificial memory portions and said physically separating the M normal memory portions from each other are performed simultaneously using a single lithographic step.

4. The method of claim 1, further comprising using the M normal memory portions and the N sacrificial memory portions as a blocking mask to etch the to-be-etched layer so as to form M actual normal regions and N actual sacrificial regions, respectively, from the to-be-etched layer.

5. The method of claim 1, wherein the edge printing process involves a subtractive sidewall image transfer (SIT) process.

6. The method of claim 1, wherein the edge printing process involves an additive SIT process.

7. The method of claim 1, wherein the edge printing process involves a phase-shift process.

8. The method of claim 1, wherein N is an odd number.

9. The method of claim 1, wherein N is an even number.

10. The method of claim 1, wherein the memory layer and the to-be-etched layer comprise polysilicon.

11. A structure fabrication method, comprising:
    providing a design structure that includes (i) a design substrate and (ii) M design normal regions on the design substrate, wherein M is a positive integer greater than 1;
    adding, in the design structure, N design sacrificial regions between two adjacent design normal regions of the M design normal regions, wherein N is a positive integer;
    providing an actual structure that includes (i) an actual substrate corresponding to the design substrate, (ii) a to-be-etched layer on the actual substrate, and (iii) a memory layer on the to-be-etched layer;
    performing an edge printing process on the memory layer so as to form (a) M normal memory portions aligned with the M design normal regions and (b) N sacrificial memory portions aligned with the N design sacrificial regions;

removing the N sacrificial memory portions; and then using the M normal memory portions as a blocking mask to etch the to-be-etched layer so as to form M actual normal regions from the to-be-etched layer, wherein N is an odd number.

12. The method of claim 11, further comprising physically separating the M normal memory portions from each other, wherein said removing the N sacrificial memory portions and said physically separating the M normal memory portions from each other are performed simultaneously using a single lithographic step.

13. The method of claim 11, wherein the edge printing process involves a subtractive sidewall image transfer (SIT) process.

14. The method of claim 11, wherein the edge printing process involves an additive SIT process.

15. The method of claim 11, wherein the edge printing process involves a phase-shift process.

16. The method of claim 11, wherein the memory layer and the to-be-etched layer comprise polysilicon.

17. A structure fabrication method, comprising:

providing a design structure that includes (i) a design substrate and (ii) M design normal regions on the design substrate, wherein M is a positive integer greater than 1;

adding, in the design structure, N design sacrificial regions between two adjacent design normal regions of the M design normal regions, wherein N is a positive integer;

providing an actual structure that includes (i) an actual substrate corresponding to the design substrate, (ii) a to-be-etched layer on the actual substrate, and (iii) a memory layer on the to-be-etched layer;

performing an edge printing process on the memory layer so as to form (a) M normal memory portions aligned with the M design normal regions and (b) N sacrificial memory portions aligned with the N design sacrificial regions; and then using the M normal memory portions and the N sacrificial memory portions as a blocking mask to etch the to-be-etched layer so as to form M actual normal regions and N actual sacrificial regions, respectively, from the to-be-etched layer, wherein N is an odd number.

18. The method of claim 17, wherein the edge printing process involves a subtractive sidewall image transfer (SIT) process.

19. The method of claim 17, wherein the edge printing process involves an additive SIT process.

20. The method of claim 17, wherein the edge printing process involves a phase-shift process.

* * * * *